United States Patent [19]

Faraone

[11] Patent Number: 4,683,640
[45] Date of Patent: Aug. 4, 1987

[54] METHOD OF MAKING A FLOATING GATE MEMORY CELL

[75] Inventor: Lorenzo Faraone, Belle Mead, N.J.

[73] Assignee: RCA Corporation, Princeton, N.J.

[21] Appl. No.: 852,215

[22] Filed: Apr. 15, 1986

[51] Int. Cl.[4] .................. H01L 21/441; H01L 21/425
[52] U.S. Cl. ........................................ 437/41; 437/52; 437/225
[58] Field of Search ................... 29/571, 576 B, 578, 29/591; 148/187, DIG. 109

[56] References Cited

U.S. PATENT DOCUMENTS

| 4,162,504 | 7/1979 | Hsu | 357/23 |
|---|---|---|---|
| 4,426,764 | 1/1984 | Kosa et al. | 29/571 |
| 4,488,931 | 12/1984 | Pansana | 29/571 |
| 4,494,301 | 1/1985 | Faraone | 29/571 |
| 4,495,693 | 1/1985 | Iwahashi et al. | 29/571 |
| 4,519,849 | 5/1985 | Korsh et al. | 29/576 B |

Primary Examiner—George T. Ozaki
Attorney, Agent, or Firm—Joseph S. Tripoli; Bernard F. Plantz

[57] ABSTRACT

A method of making a floating gate memory cell wherein the capacitance between the control gate and floating gate can be independently controlled. Independent capacitance control is achieved by forming the inter-level dielectric in a step which is independent of the gate oxide growth process.

12 Claims, 7 Drawing Figures

METHOD OF MAKING A FLOATING GATE MEMORY CELL

This invention relates to a method of fabricating a floating gate memory cell. More particularly, the present invention relates to a method which provides for independent control of the thickness of the insulating layers used to make the memory cell.

BACKGROUND OF THE INVENTION

Floating gate type non-volatile semiconductor memory devices are generally known in the art. Commonly assigned U.S. Pat. No. 4,162,504 is an example of such a device. As shown in FIG. 1, the prior art device consists of source 12 and drain 14 regions formed in a semiconductor substrate 10. On the surface of the substrate 10, between the source 12 and drain 14 regions, a first insulating layer 16 is provided. A floating gate 18 is positioned over a portion of the first insulating layer 16. A second insulating layer 20 is provided above the first insulating layer 16 and the floating gate 18. A conductive layer is placed on the second insulating layer 20 to form the control gate 22. Contacts 24, 26 and 28 are provided to complete the device.

The memory cell shown in FIG. 1 functions as three serially aligned transistors. The first transistor is formed by region I of substrate 10 functioning as a channel for source and drain regions 12 and 14, respectively. Region A of the second insulator 20, along with the portion of the first insulator 16 subtended by region A, function as the gate oxide for gate 22. A second transistor is formed by the floating gate 18, the region of insulator 16 subtended by gate 18 and channel region II of the semiconductor substrate 10 which contains the source and drain regions 12 and 14, respectively. A third transistor, in series with the other transistors, is formed around channel region III with region A' of the second insulator 20 and the portion of insulator 16 subtended by region A' functioning as the gate oxide for gate 22. Region B of insulator 20 functions as an inter-level dielectric between the floating and control gates 18 and 22, respectively.

The memory cell is programmed by forming a charge on the floating gate 18 which has the effect of changing the threshold voltage for conduction between source 12 and drain 14. A typical embodiment of the device is one in which the insulator 16 is thin enough to allow electron tunneling between the floating gate 18 and the substrate 10. When a negative charge is formed on the floating gate 18, the memory cell is considered to be in the written or programmed state. A writing or programming potential of about +30 volts is applied to the control gate 22 while the source and drain regions 12 and 14, respectively, are maintained at ground or at zero potential. The device may also be programmed by applying +15 volts to the control gate 22 while −15 volts is applied to the drain 14 and the source 12 is allowed to electrically float. The memory cell may then be erased by removing the negative charge that is stored on the floating gate 18. This is done by applying a −30 volts to the control gate 22 while the source and drain 12 and 14, respectively, are at zero or ground potential. The cell can also be erased by providing the control gate 22 with a potential of about −15 volts while maintaining +15 volts on the drain 14 and allowing the source 12 to float. The cell can also be erased by exposure to ultraviolet radiation which will discharge the floating gate 18.

Referring again to FIG. 1, these devices are fabricated by forming a thin first insulating layer 16 on the surface of the semiconductor substrate 10. This layer 16 may be, for example, thermally grown silicon dioxide. The first insulating layer 16 functions as the gate oxide for the floating gate 18 which is later formed. This layer 16 is also known as the tunnel oxide.

After the oxide layer 16 is formed, a conductive layer of polycrystalline silicon (polysilicon) is deposited over the gate oxide layer 16. This conductive layer is typically deposited via chemical vapor deposition techniques, doped and patterned to form the floating gate 18.

Once the floating gate 18 has been formed, a second insulating layer 20 is provided over both the gate oxide layer 16 and the floating gate 18. This second insulating layer 20 may also be thermally grown silicon dioxide.

A polycrystalline silicon layer is then deposited atop the second insulating layer 20. This polycrystalline layer is doped and patterned to form the control gate 22. Source 12 and drain 14 regions are formed in the semiconductor substrate 10 such that they are aligned to the control gate 22. Contacts 24, 26 and 28 are added and a passivating layer (not shown) is deposited to complete the device.

The above-described method has an inherent drawback because the inter-level dielectric region B between the floating gate 18 and the control gate 22 is simultaneously formed when the gate oxide regions A and A' are grown. Thus, the thickness of the gate oxide regions A and A' will often dictate the thickness of the inter-level dielectric region B or vice versa. It is necessary in the memory cell art to have independent control of the thicknesses of the inter-level dielectric region B so that the capacitance between the control gate 22 and the floating gate 18 can be optimized. If non-memory cell transistors are simultaneously being formed, it is also necessary to have independent control of the thickness of the gate oxide for these devices.

SUMMARY OF THE INVENTION

A method of making a floating gate storage device including the steps of forming a first insulating layer on a semiconductor substrate, applying a first electroconductive layer to a portion of the first insulating layer and then covering the first electroconductive layer with a second insulating layer. A mask is then applied to the second insulating layer and the gate oxide is formed. The mask is removed and a second electroconductive layer is formed on the second insulating layer and on a portion of the gate oxide.

DETAILED DESCRIPTION OF THE PREFERRED EMBODIMENT

Referring to FIGS. 2a to 2f, the method of the present invention will be described for making an n-channel EEPROM (Electrically Erasable Programmable Read Only Memory) device.

Figure 1:
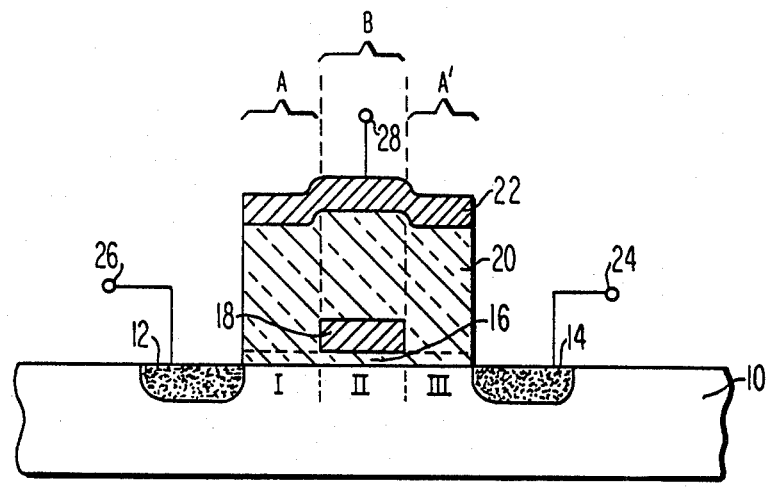
FIG. 1 is a cross-sectional view of the floating gate memory cell found in the prior art.
Figure 2A:
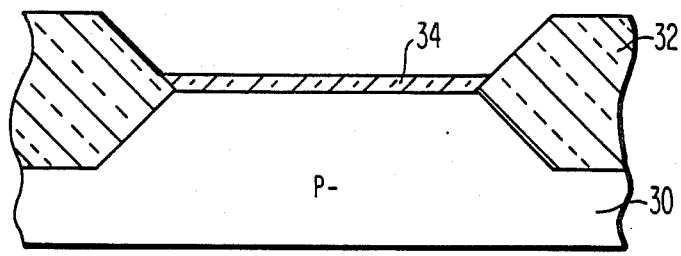
FIGS. 2a to 2f are sectional views of a portion of the memory cell illustrating the steps of the method of the present invention.

As shown in FIG. 2a, the method of the present invention starts with a single crystal silicon substrate 30 which has been lightly doped with a p-type dopant.

Standard LOCOS (Local Oxidation of Silicon) techniques are preformed on the substrate 30 to form active-area regions which are surrounded by the inactive field oxide regions 32. A thin first insulating layer 34 of silicon dioxide is formed on the exposed surface of the silicon substrate 30. The first insulating layer or tunnel oxide 34 is formed by heating the substrate to a temperature of about 800° C. in an oxygen atmosphere containing about 10% steam. The SiO₂ layer 34 typically has a thickness of about 100 Å.

Figure 2B:
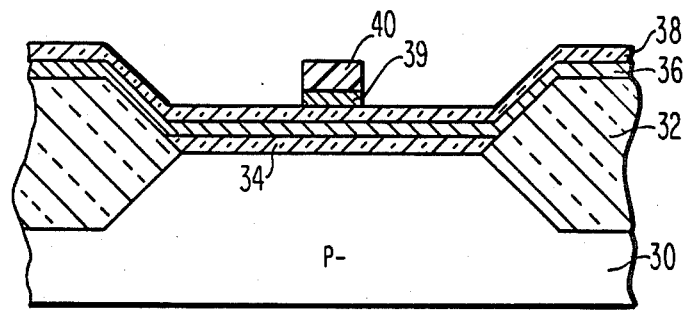

As shown in FIG. 2b, a first electroconductive layer 36, used to make the floating gate, is deposited atop the exposed portions of the first insulating layer 34 and the field oxide 32. The first electroconductive layer 36 has a thickness of about 2000–5000 Å. Layer 36 is typically polycrystalline silicon which is deposited by conventional chemical vapor deposition techniques. Dopants, typically n-type, are introduced into the polycrystalline silicon layer by conventional ion implantation or diffusion techniques. Other conventional gate materials may be substituted for the doped polycrystalline silicon.

A second insulating or inter-level dielectric layer 38 is formed on the exposed areas of layer 36. The inter-level dielectric layer 38 may be, for example, fabricated by thermally growing silicon dioxide or by chemically vapor depositing silicon nitride or silicon oxynitride. The method of the present invention is used to fabricate a memory cell which relies on bulk-silicon-to-poly conduction to charge and discharge the floating gate. Thus, it is desirable to have high capacitance between the control and floating gates. One way of producing high capacitance is to have a large amount of overlap between the control and floating gates. High capacitance can also be achieved by fabricating layer 38 so that it is very thin and/or has a high dielectric constant. For example, when silicon dioxide having a relative dielectric constant of 3.9 is used as the inter-level dielectric layer 38, it is deposited to a thickness of about 300–400 Å. Alternatively, the desired high capacitance can also be achieved by depositing silicon nitride having a relative dielectric constant of 7.5 to thickness of about 600–700 Å.

An oxidation resistant mask 39, such as silicon nitride, is deposited by conventional techniques and plasma etched using a photoresist mask 40 so that it remains only on a portion of the inter-level dielectric layer 38. These techniques are similar to those described in commonly assigned U.S. Pat. No. 4,494,301 which is hereby incorporated by reference. The structure is then subjected to a conventional plasma etching environment to remove the portions of the inter-level dielectric 38 and first electroconductive layer 36 not subtended by oxidation resistant mask 39 and photoresist 40. This etching operation defines the floating gate 37. The photoresist 40 is removed and the resulting silicon nitride mask 39/inter-level dielectric 38/floating gate 37 structure is shown in FIG. 2c.

Figure 2C:
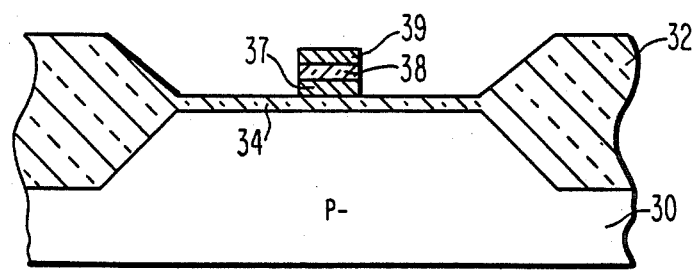
Figure 2D:
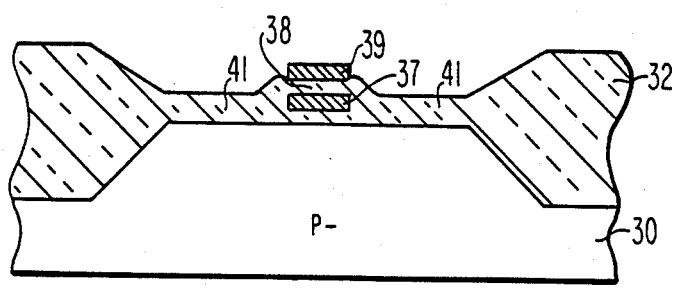

The structure shown in FIG. 2c is then thermally oxidized in an environment similar to that described in commonly assigned U.S. Pat. No. 4,494,301 to produce the structure shown in FIG. 2d. During this oxidation step, the gate oxide 41 for the subsequently formed control gate is grown on areas not subtended by the mask 39. The gate oxide 41 has a thickness of about 350 Å. If non-memory cell transistors are also being formed, the gate oxide for these devices will simultaneously be formed during this oxidation step.

Figure 2E:
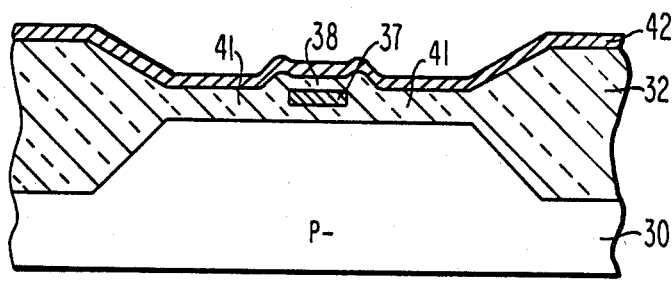
Figure 2F:
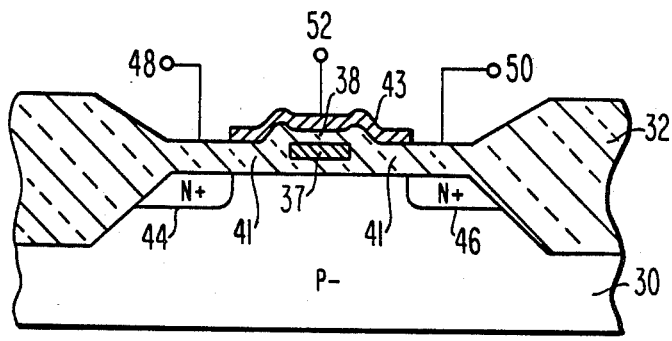

As shown in FIG. 2e, the oxidation resistant mask 39 is removed by conventional wet etching techniques. Alternatively, if the oxidation resistant mask 39 has the appropriate insulating properties, it may be desirable to leave layer 39 on layer 38 to form a dual layered inter-level dielectric (not shown). Silicon nitride is an example of a material which would have the appropriate insulating properties. Then, a second electroconductive layer 42, having a thickness of about 5000 Å, is applied over the field oxide 32, gate oxide 41 and the inter-level dielectric 38. Electroconductive layer 42 is typically polycrystalline silicon which has been deposited by chemical vapor deposition techniques and doped with an n-type dopant. However, other conventional gate materials, such as a metal silicide, may be used for layer 42. An etch-resistant mask (not shown) is applied directly to a portion of the electroconductive layer 42 and the control gate 43 is patterned by plasma etching the exposed portions of layer 42 which extend over the field oxide regions 32 shown in FIG. 2f. As discussed earlier, it is desirable to have high capacitance between the control and floating gates. Thus, the control gate 43 is patterned so that it overlaps the floating gate 37 in both the active-area region and in the areas where the floating gate 37 extends over the field oxide regions which are perpendicular to the cross-section shown in FIG. 2f. The etch-resistant mask is then removed.

The source 44 and drain 46 regions are formed by using the control gate 43 as a mask. Conventional doping techniques, such as ion implantation, are used to introduce n-type dopants into the substrate 30. Since the control gate is used as a mask for the doping operation, the N+ source 44 and N+ drain 46 regions are self-aligned with the control gate. The device is then completed by forming source 48, drain 50 and control gate 52 contacts using conventional metallization techniques, such as physical vapor deposition.

Although FIGS. 2a to 2f illustrate the process steps for making an n-channel memory cell, the method of the present invention also includes the formation of p-channel devices and the like. For example, a p-channel EEPROM can be fabricated by forming p-type source and drain regions in a lightly doped n-type single crystal silicon substrate using the process described above.

The method of the present invention has the unique advantage of forming the inter-level dielectric region independently of the gate oxide formation step. Thus, the thickness of the inter-level dielectric level can be controlled so that the desired capacitance between the control gate and the floating gate can be achieved. In fact, the method of the present invention allows for the growth of an inter-level dielectric which possesses high capacitance so that conduction between the control gate and floating gate is reduced. The increased capacitance and reduced conduction from the control gate to the floating gate results in improved cell efficiency.

A further advantage of the method of this invention is that a material other than the gate oxide for the control gate can be used as the inter-level dielectric. Thus, the capacitance and conduction between the control gate and the floating gate can also be controlled by using an insulating material with the appropriate dielectric constant.

A still further advantage of the method of the present invention is that a self-aligning technique is used to form the source and drain regions. When using this technique, integrated circuits with increased device density can be fabricated.

I claim:

1. A method of making a floating gate storage device comprising the steps of:
   (a) forming a first insulating layer on a semiconductor substrate;
   (b) forming a first electroconductive layer on a portion of said first insulating layer;
   (c) forming a second insulating layer on said first electroconductive layer;
   (d) forming a mask on said second insulating layer;
   (e) forming a gate oxide on areas not subtended by said mask;
   (f) removing said mask; and
   (g) forming a second electroconductive layer on said second insulating layer and on a portion of said gate oxide.

2. A method of making a floating gate storage device in accordance with claim 1 further comprising the step of introducing impurities into said semiconductor substrate with said second electroconductive layer functioning as a mask to form source and drain regions.

3. A method of making a floating gate storage device in accordance with claim 2 further comprising the step of forming contacts on said source and drain regions.

4. A method of making a floating gate storage device in accordance with claim 2 wherein said impurities are introduced into said substrate by ion implantation.

5. A method of making a floating gate storage device in accordance with claim 2 wherein said semiconductor substrate is p-type single crystal silicon and said impurities are n-type.

6. A method of making a floating gate storage device in accordance with claim 2 wherein said semiconductor substrate is n-type single crystal silicon and said impurities are p-type.

7. A method of making a floating gate storage device in accordance with claim 1 wherein said first insulating layer is formed by thermally oxidizing said semiconductor substrate.

8. A method of making a floating gate storage device in accordance with claim 1 wherein said first and second electroconductive layers are n-doped polycrystalline silicon.

9. A method of making a floating gate storage device in accordance with claim 1 wherein said second insulating layer is a material selected from the group consisting of silicon dioxide, silicon nitride and silicon oxynitride.

10. A method of making a floating gate storage device in accordance with claim 9 wherein said silicon dioxide layer is formed by thermally oxidizing said first electroconductive layer.

11. A method of making a floating gate storage device in accordance with claim 1 wherein said first insulating layer is formed on the active-area regions of said semiconductor substrate.

12. A method of making a floating gate storage device in accordance with claim 1 wherein said mask is oxidation resistant and said gate oxide is formed by thermally oxidizing said semiconductor substrate.

* * * * *